US008587029B2

(12) United States Patent
Wang et al.

(10) Patent No.: US 8,587,029 B2
(45) Date of Patent: Nov. 19, 2013

(54) SEMICONDUCTOR STRUCTURE AND METHOD FOR FORMING THE SAME

(75) Inventors: Jing Wang, Beijing (CN); Lei Guo, Beijing (CN)

(73) Assignee: Tsinghua University (CN)

( * ) Notice: Subject to any disclaimer, the term of this patent is extended or adjusted under 35 U.S.C. 154(b) by 0 days.

(21) Appl. No.: 13/376,429

(22) PCT Filed: Nov. 11, 2011

(86) PCT No.: PCT/CN2011/082110
§ 371 (c)(1),
(2), (4) Date: Dec. 6, 2011

(87) PCT Pub. No.: WO2012/163047
PCT Pub. Date: Dec. 6, 2012

(65) Prior Publication Data
US 2012/0305988 A1  Dec. 6, 2012

(30) Foreign Application Priority Data

Jun. 3, 2011  (CN) .......................... 2011 1 0149714

(51) Int. Cl.
*H01L 29/78* (2006.01)
(52) U.S. Cl.
USPC ............................ 257/192; 438/303; 438/285
(58) Field of Classification Search
USPC .............................................. 257/192, 87, 36
See application file for complete search history.

(56) References Cited

U.S. PATENT DOCUMENTS 6,940,098 B1 *  9/2005  Tadatomo et al. ............... 257/87
7,211,458 B2 *  5/2007  Ozturk et al. ................... 438/36

OTHER PUBLICATIONS

Tiwari el at., Shape Memory Device, Apr. 2007, Patent Application Publication, US2007/0086237A1.*

* cited by examiner

*Primary Examiner* — Telly Green
*Assistant Examiner* — Damon Hillman
(74) *Attorney, Agent, or Firm* — Lerner, David, Littenberg, Krumholz & Mentlik, LLP

(57) ABSTRACT

A semiconductor structure and a method for forming the same are provided. The semiconductor structure includes a substrate; a plurality of convex structures formed on the substrate, in which every two adjacent convex structures are separated by a cavity; a plurality of floated films, in which each floated film is formed between the every two adjacent convex structures and connected with tops of the every two adjacent convex structures, the floated films are partitioned into a plurality of sets, a channel layer is formed on a convex structure between the floated films in each set, a source region and a drain region are formed on two sides of the channel layer respectively, and an isolation portion is set between two adjacent sets of floated films; and a gate stack formed on each channel layer.

18 Claims, 4 Drawing Sheets

SEMICONDUCTOR STRUCTURE AND METHOD FOR FORMING THE SAME

CROSS-REFERENCE TO RELATED PATENT APPLICATIONS

The present application is a national phase entry under 35U.S.C. §371 of International Application No. PCT/CN2011/082110 filed Nov. 11, 2011, published in English, which claims priority from Chinese Application No. 201110149714.5, filed Jun. 3, 2011, all of which are incorporated herein by reference.

FIELD OF THE INVENTION

The present disclosure relates to a semiconductor manufacture and design, and more particularly to a semiconductor structure and a method for forming the same.

BACKGROUND OF THE INVENTION

For a long time, in order to achieve a higher chip density, a faster working speed and a lower power consumption, a feature size of a MOSFET (metal-oxide-semiconductor field effect transistor) is continuously scaled down according to Moore's law, and a working speed of the MOSFET is faster and faster. Currently, the feature size of the MOSFET has reached a nanometer level. However, a serious challenge is an emergence of a short-channel effect, such as a subthreshold voltage roll-off ($V_t$ roll-off), a DIBL (drain-induced barrier lowering) and a source-drain punch through, thus increasing an off-state leakage current. Therefore, a performance of the MOSFET may be deteriorated.

In addition, a leakage may be alleviated by a SOI (silicon on insulator) structure, however, a heat conductivity of a $SiO_2$ insulating layer in the SOI structure is low, so that a heat generated in a channel in a small size device may be difficult to dissipate. Therefore, a heat dissipation of the SOI structure may be inhibited.

Therefore, for a conventional device, large leakage and difficult heat dissipation are main constraints for scaling down.

SUMMARY OF THE INVENTION

The present disclosure is aimed to solve at least one of the above mentioned technical problems.

According to an aspect of the present disclosure, a semiconductor structure is provided. The semiconductor structure comprises: a substrate; a plurality of convex structures formed on the substrate, in which every two adjacent convex structures are separated by a cavity in a predetermined pattern, and the cavity size between every two adjacent convex structures is less than 50 nm in width; a plurality of floated films, in which each floated film is formed between the every two adjacent convex structures and connected with tops of the every two adjacent convex structures, the floated films are partitioned into a plurality of sets, a channel layer is formed on a convex structure between the floated films in each set, a source region and a drain region are formed on two sides of the channel layer respectively, and an isolation portion is set between two adjacent sets of floated films; and a gate stack formed on each channel layer.

In one embodiment, a width of each convex structure increases gradually from a middle part thereof to a top part thereof so that a cavity size between top parts of two adjacent convex structures is less than that between middle parts of the two adjacent convex structures.

In one embodiment, a material forming each convex structure comprises Si, $Si_yGe_{1-y}$ or Ge.

In one embodiment, each convex structure comprises a bottom layer and a top layer, the bottom layer is a Si layer, and the top layer is a $Si_yGe_{1-y}$ layer or a Ge layer.

In one embodiment, the plurality of floated films are formed by annealing the plurality of convex structures at a temperature of 300-1350 degrees Celsius in an ambient containing hydrogen.

In one embodiment, each floated film is a Si layer, a $Si_yGe_{1-y}$ layer or a Ge layer.

In one embodiment, there are two floated films in each set.

In one embodiment, there are three floated films in each set, and the three floated films are set as a source region, a drain region and a source region sequentially, or the three floated films are set as a drain region, a source region and a drain region sequentially.

In one embodiment, the ambient further comprises at least one gas selected from a group consisting of $SiH_4$, $GeH_4$, $SiH_2Cl_2$, and $SiHCl_3$.

In one embodiment, the semiconductor structure further comprises: a side wall of one or more layers formed on sides of the gate stack.

According to another embodiment of the present disclosure, a method for forming a semiconductor structure is provided. The method comprises steps of: providing a substrate; forming a plurality of convex structures on the substrate, in which every two adjacent convex structures are separated by a cavity in a predetermined pattern, and the cavity size between every two adjacent convex structures is less than 50 nm in width; forming a semiconductor film on tops of the plurality of convex structures, in which a first part of the semiconductor film on the cavity is spaced apart from the substrate to form a plurality of floated films; partitioning the plurality of floated films into a plurality of sets; etching a second part of the semiconductor film on a convex structure between two adjacent sets of floated films to form an isolation portion between two adjacent sets of floated films; setting a third part of the semiconductor film on a convex structure between the floated films in each set as a channel layer and forming a source region and a drain region in the floated films on two sides of the channel layer respectively; and forming a gate stack on each channel layer.

In one embodiment, a width of each convex structure increases gradually from a middle part thereof to a top part thereof so that a cavity size between top parts of two adjacent convex structures is less than that between middle parts of the two adjacent convex structures.

In one embodiment, a material forming each convex structure comprises Si, $Si_yGe_{1-y}$ or Ge.

In one embodiment, each convex structure comprises a bottom layer and a top layer, the bottom layer is a Si layer, and the top layer is a $Si_yGe_{1-y}$ layer or a Ge layer.

In one embodiment, the plurality of floated films are formed by annealing the plurality of convex structures at a temperature of 300-1350 degrees Celsius in an ambient containing hydrogen.

In one embodiment, there are two floated films in each set.

In one embodiment, there are three floated films in each set, and the three floated films are set as a source region, a drain region and a source region sequentially, or the three floated films are set as a drain region, a source region and a drain region sequentially.

In one embodiment, the ambient further comprises at least one gas selected from a group consisting of $SiH_4$, $GeH_4$, $SiH_2Cl_2$, and $SiHCl_3$.

In one embodiment, the step of forming a semiconductor film on the plurality of convex structures comprises: forming the semiconductor film on the plurality of convex structures by epitaxy.

In one embodiment, the step of forming a plurality of convex structures on the substrate comprises: forming a first semiconductor layer on the substrate; implanting Si or Ge ions into the first semiconductor layer to form an ion-implanted layer in the first semiconductor layer; and selectively etching the first semiconductor layer to form the plurality of convex structures.

According to an embodiment of the present disclosure, the floated films are used as a source region and a drain region respectively. In this way, on one hand, dopants in the source and the drain maybe prevented from diffusing into a substrate, so that an ultra-shallow junction may be easy to fabricate. On the other hand, the source and the drain may not contact with the substrate, thus inhibiting band-to-band tunneling (BTBT) leakage between the source and the substrate and between the drain and the substrate. Furthermore, parasitic junction capacitance of the source and the drain may be reduced, thus improving the performance of the device. Moreover, with the semiconductor structure according to an embodiment of the present disclosure, the floated films, for example, a Si layer, a $Si_yGe_{1-y}$ layer, a Ge layer, or an III-V group compound semiconductor layer, may be formed, thus improving the performance of the device.

Conventionally, if a SOI structure is used, a heat dissipation of a channel may be hindered by an insulating layer. However, with the semiconductor structure according to an embodiment of the present disclosure, by using the convex structures as a channel, a problem of inhibiting the heat dissipation of the channel by the insulating layer in the SOI structure may be effectively alleviated, and a leakage of the device may be reduced like the SOI structure, thus improving the performance of the device.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION OF THE INVENTION

Figure 1:
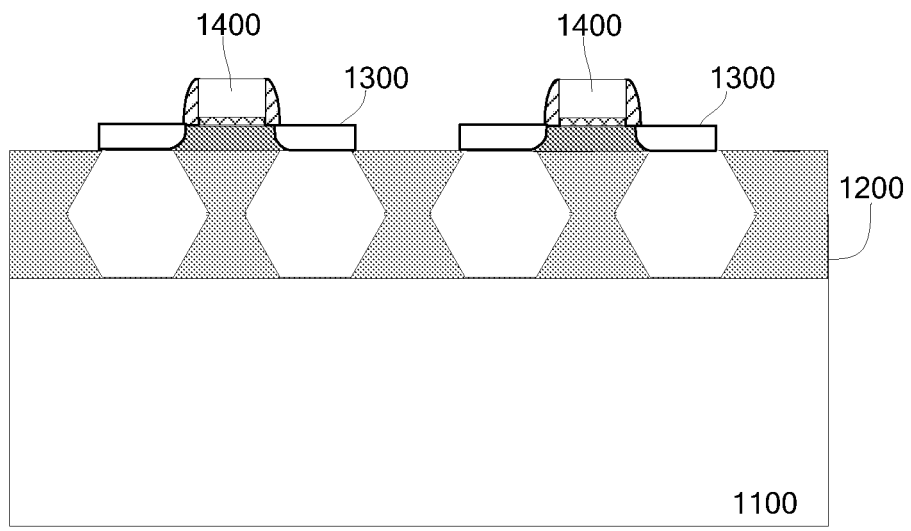
FIG. 1 is a cross-sectional view of a semiconductor structure according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

Figure 2:
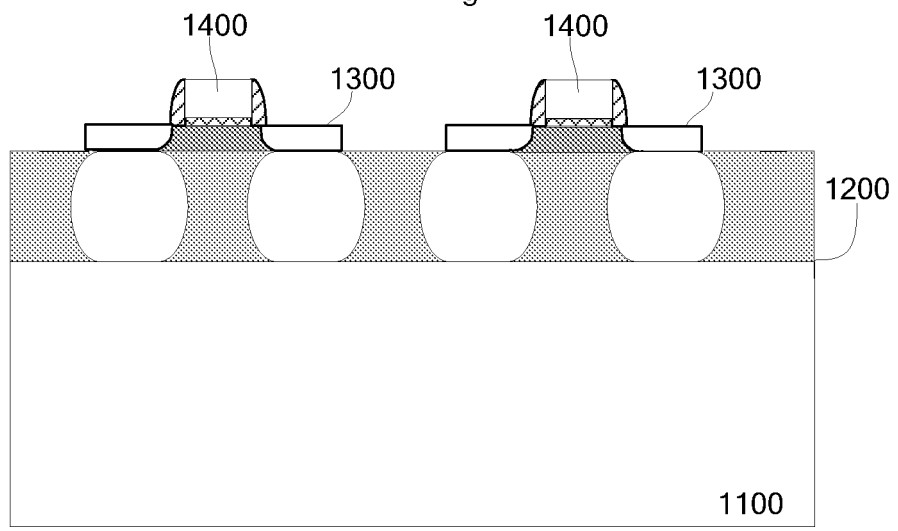
FIG. 2 is a cross-sectional view of a semiconductor structure according to another embodiment of the present disclosure.

FIG. 1 is a cross-sectional view of a semiconductor structure according to an embodiment of the present disclosure. FIG. 2 is a cross-sectional view of a semiconductor structure according to another embodiment of the present disclosure. The semiconductor structure comprises a substrate 1100; a plurality of convex structures 1200 formed on the substrate 1100, in which every two adjacent convex structures 1200 are separated by a predetermined pattern. In some embodiments, a cavity size between every two adjacent convex structures is less than 50 nm in width, preferably, 30 nm. It should be noted that, in some embodiments, the convex structures 1200 may be a vertical structure. However, in other embodiments, as shown in FIGS. 1-2, a width of each convex structure 1200 increases gradually from a middle part thereof to a top part thereof so that a cavity size between top parts of two adjacent convex structures 1200 is less than that between middle parts of the two adjacent convex structures 1200. Therefore, a plurality of floated films 1300 may be formed by annealing the convex structures 1200 or by epitaxy. If the cavity size between top parts of two adjacent convex structures 1200 is less than that between middle parts of the two adjacent convex structures 1200, the cavity size between every two adjacent convex structures is the nearest cavity size between the two adjacent convex structures 1200, i.e., the cavity size between the top parts of the two adjacent convex structures 1200. The semiconductor structure according to an embodiment of the present disclosure may be applied to a small size device, particularly used for alleviating a leakage of a small size device.

The semiconductor structure further comprises a plurality of floated films 1300, in which each floated film 1300 is formed between the every two adjacent convex structures 1200 and connected with tops of the every two adjacent convex structures 1200, the floated films 1300 are partitioned into a plurality of sets, a channel layer is formed on a convex structure 1200 between the floated films 1300 in each set, and a source region and a drain region are formed on two sides of the channel layer respectively. The semiconductor structure further comprises a gate stack 1400 formed on each channel layer. The gate stack 1400 comprises a gate dielectric layer and a gate electrode, for example, a high k gate dielectric layer. In this embodiment, two independent semiconductor structures are shown, each semiconductor structure forms a device, and the two devices are isolated from each other. Particularly, an isolation portion is set in a convex structure 1200 between two adjacent sets of floated films 1300. In some embodiments, there are two floated films 1300 in each set. In some embodiments, the floated films 1300 are very thin, and are below about 10 nm, and consequently may be used for fabricating an ultra-shallow junction.

In one embodiment, the substrate 1100 is a Si substrate or a SiGe substrate with low Ge content, and each floated film 1300 is a Si layer, a $Si_yGe_{1-y}$ layer, or a Ge layer. In another embodiment, if the floated films 1300 are formed by epitaxy, each floated film 1300 may also be an III-V group compound semiconductor layer.

In one embodiment, a material forming each convex structure 1200 comprises Si, $Si_yGe_{1-y}$ or Ge. In some embodiments, the plurality of floated films 1300 may be formed by annealing the plurality of convex structures 1200. In some embodiments, the annealing is performed at a temperature of 300-1350 degrees Celsius in an ambient containing hydrogen to migrate atoms on surfaces of the plurality of convex structures 1200. Since the ambient contains hydrogen, hydrogen may effectively facilitate a migration of atoms on surfaces of the plurality of convex structures 1200. Preferably, when the material forming each convex structure 1200 comprises SiGe with high Ge content or Ge, the ambient further comprises at least one gas selected from a group consisting of $SiH_4$, $GeH_4$, $SiH_2Cl_2$, and $SiHCl_3$. A small amount of Si and/or Ge atoms are deposited on the surface of the floated films 1300 by decomposing the at least one gas, so that the surface of the floated films 1300 may be flattened, and a required flatness is achieved. After the annealing, the top parts of two adjacent convex structures 1200 may be connected with each other to form the floated films 1300. In this embodiment, the higher the content of Ge in the floated films 1300, the lower the annealing temperature is. For example, if the floated films 1300 are a Ge layer, the annealing temperature may be 300 degrees Celsius.

Figure 3:
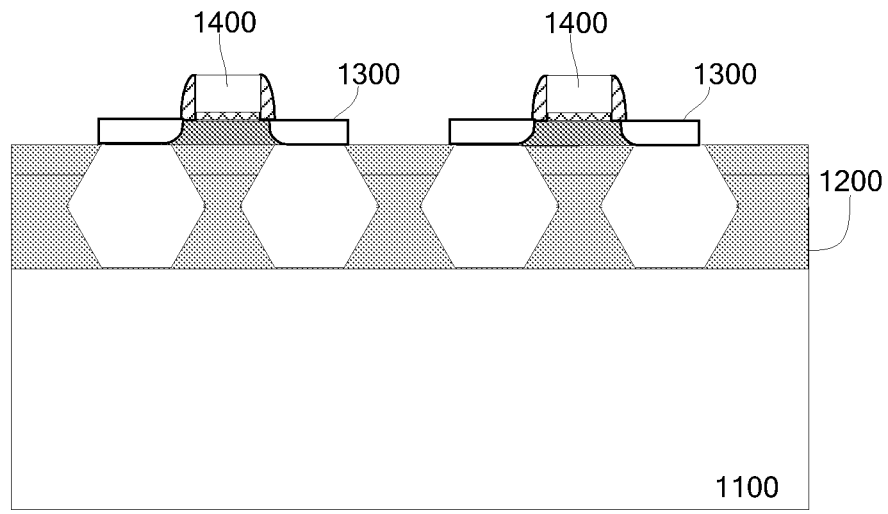
FIG. 3 is a cross-sectional view of a semiconductor structure according to still another embodiment of the present disclosure.

In another embodiment, each convex structure 1200 comprises a bottom layer and a top layer. FIG. 3 is a cross-sectional view of a semiconductor structure according to still another embodiment of the present disclosure. In some embodiments, the bottom layer is a Si layer, and the top layer is a $Si_yGe_{1-y}$ layer or a Ge layer. For example, as shown in FIG. 3, each convex structure 1200 comprises a SiGe layer with low Ge content and a Ge layer. In this way, the SiGe layer with low Ge content may be used as a buffer layer between the substrate 1100 and the Ge layer.

In one embodiment, the semiconductor structure further comprises a side wall of one or more layers formed on sides of the gate stack 1400. Therefore, an interface layer between the channel layer and the source region and another interface layer between the channel layer and the drain region may extend to the convex structures, thus improving interfacial characteristics of a junction and further improving a performance of a device.

Figure 4:
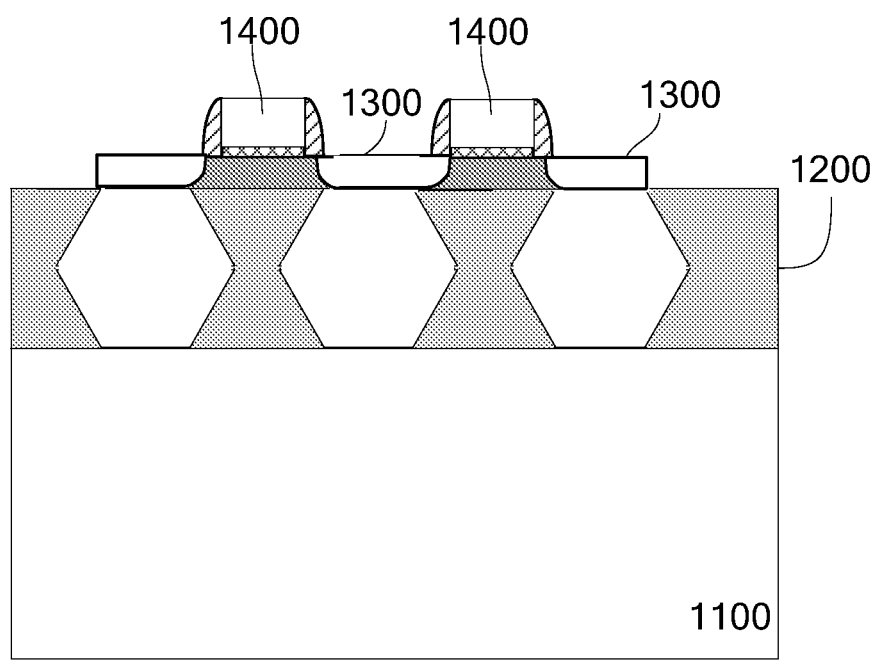
FIG. 4 is a cross-sectional view of a semiconductor structure with a common source region or a common drain region according to an embodiment of the present disclosure.
Figure 5:
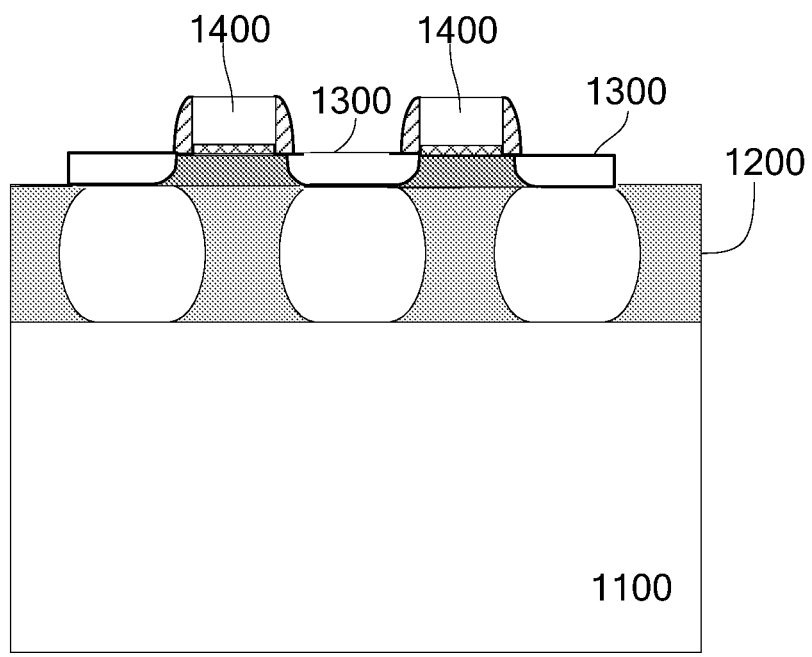
FIG. 5 is a cross-sectional view of a semiconductor structure with a common source region or a common drain region according to another embodiment of the present disclosure.

In other embodiments, a semiconductor structure with a common source region and a common drain region may also be formed, as shown in FIGS. 4-5. In this embodiment, there are three floated films 1300 in each set, and the three floated films 1300 are set as a source region, a drain region and a source region sequentially, or the three floated films 1300 are set as a drain region, a source region and a drain region sequentially.

Figure 6:
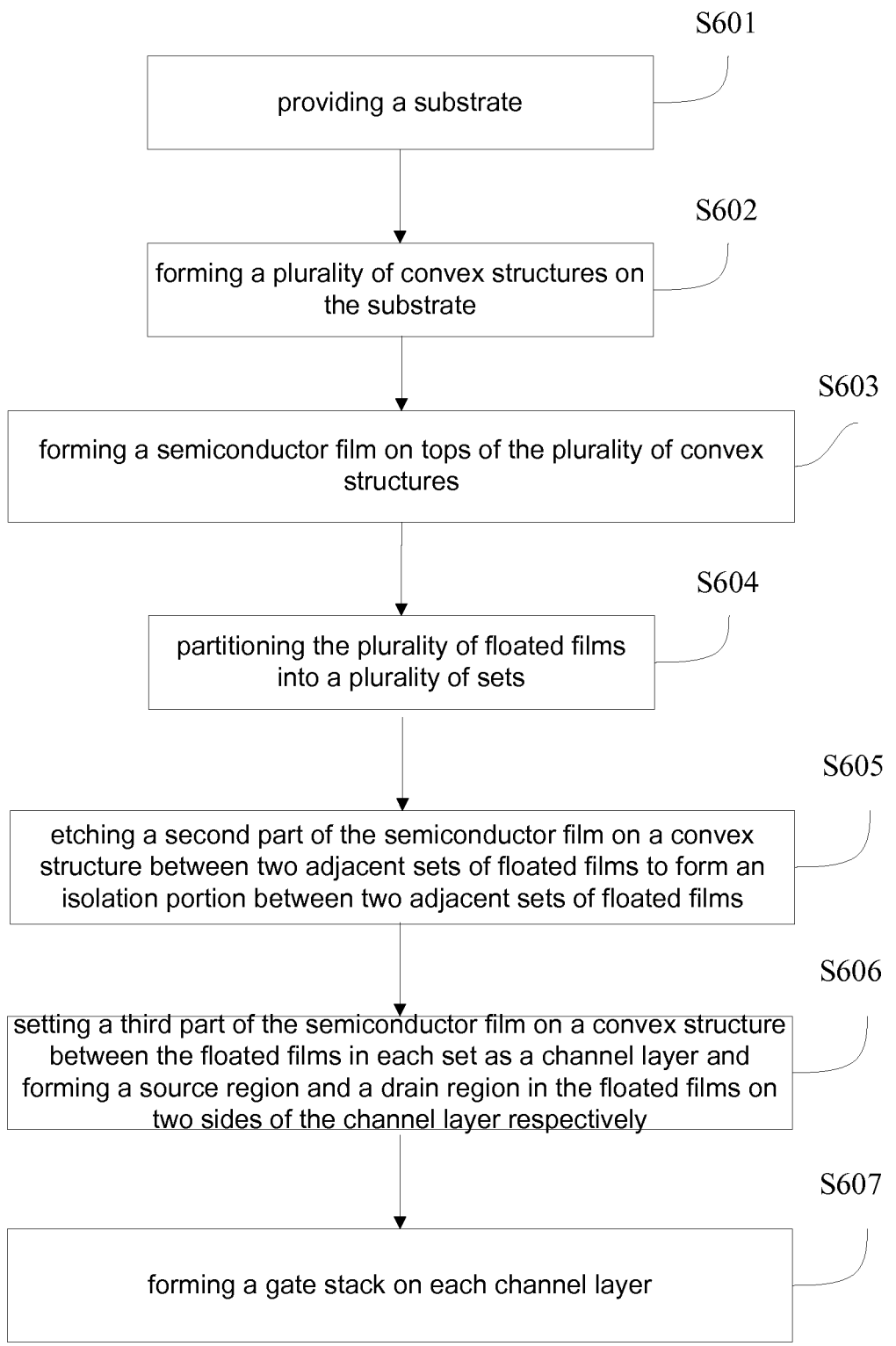
FIG. 6 is a flow chart of a method for forming a semiconductor structure according to an embodiment of the present disclosure.

FIG. 6 is a flow chart of a method for forming a semiconductor structure according to an embodiment of the present disclosure. The method comprises the following steps.

Step S601, a substrate is provided. The substrate is a Si substrate or a SiGe substrate with low Ge content.

Step S602, a plurality of convex structures are formed on the substrate, in which every two adjacent convex structures are separated by a predetermined pattern. In some embodiments, a cavity size between every two adjacent convex structures is less than 50 nm in width, and preferably, 30 nm. A width of each convex structure increases gradually from a middle part thereof to a top part thereof so that a cavity size between top parts of two adjacent convex structures is less than that between middle parts of the two adjacent convex structures. Therefore, a floated film may be formed by annealing the convex structures or by epitaxy. Particularly, in some embodiments, at least one first semiconductor layer is formed on the substrate by epitaxy, and then the at least one first semiconductor layer is etched to form the plurality of convex structures, in which the at least one first semiconductor layer is a Si layer, a SiGe layer or a Ge layer. Certainly, in other embodiments, a surface layer of the substrate is used as the first semiconductor layer, that is, a surface of the substrate is directly etched to form the plurality of convex structures. Preferably, in order to form the plurality of convex structures shown in FIG. 1, the first semiconductor layer may be etched by an anisotropic wet etching.

Alternatively, in another preferred embodiment, Si or Ge ions are implanted into the first semiconductor layer to form an ion-implanted layer in the first semiconductor layer, and then the first semiconductor layer is selectively etched by a dry etching to form the plurality of convex structures. Because crystal structures in the ion-implanted layer are damaged seriously, an etching rate in the ion-implanted layer is greater than that in other parts of the first semiconductor layer, thus forming the plurality of convex structures shown in FIG. 2.

Step S603, a semiconductor film is formed on tops of the plurality of convex structures, in which a first part of the semiconductor film on the cavity is spaced apart from the substrate to form a plurality of floated films.

Step S604, the plurality of floated films are partitioned into a plurality of sets. In some embodiments, each floated film is a Si layer, a $Si_yGe_{1-y}$ layer or a Ge layer.

In one embodiment, there are two floated films in each set. In another embodiment, there are three floated films in each set, and the three floated films are set as a source region, a drain region and a source region sequentially, or the three floated films are set as a drain region, a source region and a drain region sequentially.

In one embodiment, a material forming each convex structure comprises Si, $Si_yGe_{1-y}$ or Ge, so that the plurality of floated films may be formed by annealing the plurality of convex structures. In some embodiments, the annealing is performed at a temperature of 300-1350 degrees Celsius in an ambient containing hydrogen to migrate atoms on surfaces of the plurality of convex structures. Preferably, the ambient further comprises at least one gas selected from a group consisting of $SiH_4$, $GeH_4$, $SiH_2Cl_2$, and $SiHCl_3$. A small amount of Si and/or Ge atoms are deposited on the surface of the floated films by decomposing the at least one gas, so that the surface of the floated films may be flattened.

In one embodiment, each convex structure comprises a bottom layer and a top layer, the bottom layer is a Si layer, and the top layer is a $Si_yGe_{1-y}$ layer or a Ge layer.

In another embodiment, the floated films may also be formed by epitaxy. In this embodiment, the semiconductor film is formed on the plurality of convex structures by epitaxy. In some embodiments, the substrate may be a Si substrate, a $Si_{1-x}C_x$ substrate, a SiGe substrate or a Ge substrate with a surface of a crystal orientation (100), in which x is within a range from 0 to 0.1. Because a lateral epitaxial growth rate of the floated films with a certain crystal orientation is not less than a longitudinal growth rate thereof, a gap between top parts of two adjacent convex structures may be quickly sealed up by epitaxial materials. Therefore, the floated films may not contact with the substrate directly, so that a part of the floated film may be spaced apart from the substrate. In another embodiment, if the floated films are formed by epitaxy, the floated films may also be an III-V group compound semiconductor layer. In one preferred embodiment, after the annealing or the epitaxy, if the floated films are thick, the floated films may be subjected to an etching or a thinning process.

Step S605, a second part of the semiconductor film on a convex structure between two adjacent sets of floated films is etched to form an isolation portion between two adjacent sets of floated films.

Step S606, a third part of the semiconductor film on a convex structure between the floated films in each set is set as a channel layer and a source region and a drain region are formed in the floated films on two sides of the channel layer respectively.

Step S607, a gate stack is formed on each channel layer.

In one embodiment, a side wall of one or more layers is formed on sides of the gate stack.

According to an embodiment of the present disclosure, the floated films are used as a source region and a drain region respectively. In this way, on one hand, dopants in the source and the drain maybe prevented from diffusing into a substrate, so that an ultra-shallow junction may be easy to fabricate. On the other hand, the source and the drain may not contact with the substrate, thus inhibiting BTBT leakage between the source and the substrate and between the drain and the substrate. Furthermore, parasitic junction capacitance of the source and the drain may be reduced, thus improving the performance of the device. Moreover, with the semiconductor structure according to an embodiment of the present disclosure, the floated films, for example, a Si layer, a $Si_yGe_{1-y}$ layer, a Ge layer, or an III-V group compound semiconductor layer, may be formed, thus improving the performance of the device.

Conventionally, if a SOI structure is used, a heat dissipation of a channel may be hindered by an insulating layer. However, with the semiconductor structure according to an embodiment of the present disclosure, by using the convex structures as a channel, a problem of inhibiting the heat dissipation of the channel by the insulating layer in the SOI structure may be effectively alleviated, and a leakage of the device may be reduced like the SOI structure, thus improving the performance of the device.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A semiconductor structure, comprising:
a substrate;
a plurality of convex structures formed on the substrate, wherein every two adjacent convex structures are separated by a cavity in a predetermined pattern, and the cavity between every two adjacent convex structures is less than 50 nm in width;
a plurality of floated films, wherein each floated film is formed between the every two adjacent convex structures and connected with tops of the every two adjacent convex structures, the floated films are partitioned into a plurality of sets, a channel layer is formed on a convex structure between the floated films in each set, a source region and a drain region are formed on two sides of the channel layer respectively, and an isolation portion is set between two adjacent sets of floated films; and
a gate stack formed on each channel layer.

2. The semiconductor structure according to claim 1, wherein a width of each convex structure increases gradually from a middle part thereof to a top part thereof so that a cavity size between top parts of two adjacent convex structures is less than that between middle parts of the two adjacent convex structures.

3. The semiconductor structure according to claim 1, wherein a material forming each convex structure comprises Si, $Si_yGe_{1-y}$ or Ge.

4. The semiconductor structure according to claim 1, wherein each convex structure comprises a bottom layer and a top layer, the bottom layer is a Si layer, and the top layer is a $Si_yGe_{1-y}$ layer or a Ge layer.

5. The semiconductor structure according to claim 1, wherein each floated film is a Si layer, a $Si_yGe_{1-y}$ layer or a Ge layer.

6. The semiconductor structure according to claim 1, wherein there are two floated films in each set.

7. The semiconductor structure according to claim 1, wherein there are three floated films in each set, and the three floated films are set as a source region, a drain region and a source region sequentially, or the three floated films are set as a drain region, a source region and a drain region sequentially.

8. The semiconductor structure according to claim 1, further comprising:
a side wall of one or more layers formed on sides of the gate stack.

9. A method for forming a semiconductor structure, comprising steps of:
providing a substrate;
forming a plurality of convex structures on the substrate, wherein every two adjacent convex structures are separated by a cavity in a predetermined pattern, and the cavity between every two adjacent convex structures is less than 50 nm in width;
forming a semiconductor film on tops of the plurality of convex structures, wherein a first part of the semiconductor film on the cavity is spaced apart from the substrate to form a plurality of floated films;
partitioning the plurality of floated films into a plurality of sets;
etching a second part of the semiconductor film on a convex structure between two adjacent sets of floated films to form an isolation portion between two adjacent sets of floated films;
setting a third part of the semiconductor film on a convex structure between the floated films in each set as a channel layer and forming a source region and a drain region in the floated films on two sides of the channel layer respectively; and forming a gate stack on each channel layer.

10. The method according to claim 9, wherein a width of each convex structure increases gradually from a middle part thereof to a top part thereof so that a cavity size between top parts of two adjacent convex structures is less than that between middle parts of the two adjacent convex structures.

11. The method according to claim 9, wherein a material forming each convex structure comprises Si, $Si_yGe_{1-y}$ or Ge.

12. The method according to claim 9, wherein each convex structure comprises a bottom layer and a top layer, the bottom layer is a Si layer, and the top layer is a $Si_yGe_{1-y}$ layer or a Ge layer.

13. The method according to claim 9, wherein the plurality of floated films are formed by annealing the plurality of convex structures at a temperature of 300-1350 degrees Celsius in an ambient containing hydrogen.

14. The method according to claim 9, wherein there are two floated films in each set.

15. The method according to claim 9, wherein there are three floated films in each set, and the three floated films are set as a source region, a drain region and a source region sequentially, or the three floated films are set as a drain region, a source region and a drain region sequentially.

16. The method according to claim 13, wherein the ambient further comprises at least one gas selected from a group consisting of $SiH_4$, $GeH_4$, $SiH_2Cl_2$, and $SiHCl_3$.

17. The method according to claim 9, wherein the step of forming a semiconductor film on the plurality of convex structures comprises:

forming the semiconductor film on the plurality of convex structures by epitaxy.

18. The method according to claim 10, wherein the step of forming a plurality of convex structures on the substrate comprises:

forming a first semiconductor layer on the substrate;

implanting Si or Ge ions into the first semiconductor layer to form an ion-implanted layer in the first semiconductor layer; and selectively etching the first semiconductor layer to form the plurality of convex structures.

* * * * *